(12) United States Patent
Brown et al.

(10) Patent No.: US 9,525,033 B2
(45) Date of Patent: Dec. 20, 2016

(54) METHODS RELATING TO A GROUP III HFET WITH A GRADED BARRIER LAYER

(71) Applicants: David F. Brown, Woodland Hills, CA (US); Miroslav Micovic, Thousand Oaks, CA (US)

(72) Inventors: David F. Brown, Woodland Hills, CA (US); Miroslav Micovic, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/479,223

(22) Filed: Sep. 5, 2014

(65) Prior Publication Data

US 2015/0056764 A1 Feb. 26, 2015

Related U.S. Application Data

(62) Division of application No. 13/448,348, filed on Apr. 16, 2012, now Pat. No. 8,860,091.

(51) Int. Cl.
| | | |
|---|---|---|
| *H01L 29/49* | (2006.01) | |
| *H01L 29/205* | (2006.01) | |
| *H01L 29/201* | (2006.01) | |
| *H01L 29/66* | (2006.01) | |
| *H01L 29/778* | (2006.01) | |
| H01L 29/20 | (2006.01) | |
| H01L 29/423 | (2006.01) | |

(52) U.S. Cl.
CPC .......... *H01L 29/205* (2013.01); *H01L 29/201* (2013.01); *H01L 29/66431* (2013.01); *H01L 29/66462* (2013.01); *H01L 29/7783* (2013.01); *H01L 29/2003* (2013.01); *H01L 29/42316* (2013.01)

(58) Field of Classification Search
CPC ............ A01B 12/006; H01L 29/66462; H01L 29/66431
See application file for complete search history.

(56) References Cited

U.S. PATENT DOCUMENTS

| | | | |
|---|---|---|---|
| 6,377,596 B1 * | 4/2002 | Tanaka et al. ............. | 372/45.01 |
| 8,212,290 B2 | 7/2012 | Heikman | |
| 8,860,091 B2 | 10/2014 | Brown | |

(Continued)

FOREIGN PATENT DOCUMENTS

EP 2 290 675 A2 3/2011

OTHER PUBLICATIONS

From U.S. Appl. No. 13/448,348 (now U.S. Patent No. 8,860,091), Office Action mailed on Apr. 4, 2013.

(Continued)

*Primary Examiner* — Michael Shingleton
(74) *Attorney, Agent, or Firm* — Ladas & Parry

(57) ABSTRACT

A device and a method of making said wherein the device wherein the device has a group III-nitride buffer deposited on a substrate; and a group III-nitride heterostructure disposed on a surface of the group III-nitride buffer, wherein the group III-nitride heterostructure has a group III-nitride channel and a group III-nitride barrier layer disposed on a surface of the group III-nitride channel, the group III-nitride barrier layer including Al as one of its constituent group III elements, the Al having a mole fraction which varies at least throughout a portion of said group III-nitride barrier layer.

7 Claims, 2 Drawing Sheets

(56) References Cited

U.S. PATENT DOCUMENTS

| | | |
|---|---|---|
| 2005/0077541 A1 | 4/2005 | Shen |
| 2006/0108606 A1 | 5/2006 | Saxler |
| 2007/0194354 A1 | 8/2007 | Wu |
| 2010/0289067 A1 | 11/2010 | Mishra |
| 2011/0024796 A1 | 2/2011 | Miyoshi |
| 2011/0057198 A1 | 3/2011 | Fujiwara |

OTHER PUBLICATIONS

From U.S. Appl. No. 13/448,348 (now U.S. Patent No. 8,860,091), Office Action mailed on Nov. 5, 2013.

From U.S. Appl. No. 13/448,348 (now U.S. Patent No. 8,860,091), Notice of Allowance mailed on Jun. 11, 2014.

Borges, et al., "Simulations provide additional insights into GaN HFET reliability", Technology Transistor Modeling, Institute of Physics and IOP Publishing Ltd., 2006 (4 pages).

Palash Das et al., "Gate leakage current reduction with advancement of graded barrier AlGaN/GaN HEMT," Journal of Nano- and Electronic Physics. Dec. 2011, vol. 3, No. 1, pp. 972-978.

PCT International Search Report and Written Opinion mailed on Jul. 10, 2013 from the corresponding PCT application, Application No. PCT/US2013/035525.

PCT International Preliminary Report on Patentability (Chapter II) mailed on Apr. 7, 2014 from the corresponding PCT application, Application No. PCT/US2013/035525.

PCT International Preliminary Report on Patentability (Chapter I) issued on Oct. 21, 2014 from the corresponding PCT application, Application No. PCT/US2013/035525.

EPO Extended Search Report with supplementary European search report and European search opinion from European Patent Application No. 13778187.8 dated Sep. 24, 2015.

Shinohara K et al: "60-nm GaN/AlGaN DH-HEMTs with 1.0 $\Omega$•mm $R_{on}$, 2.0 A/mm $I_{dmax}$, and 153 GHz$f$T", Device Research Conference, 2009. DRC 2009, IEEE, Piscataway, NJ, USA, Jun. 22, 2009 (Jun. 22, 2009), pp. 167-168.

\* cited by examiner

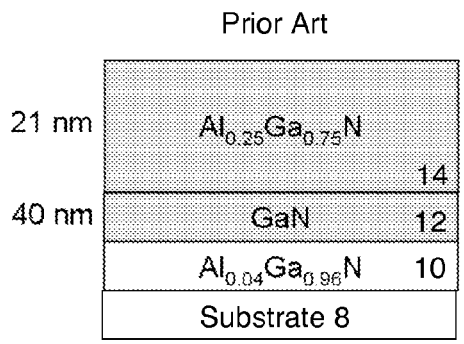 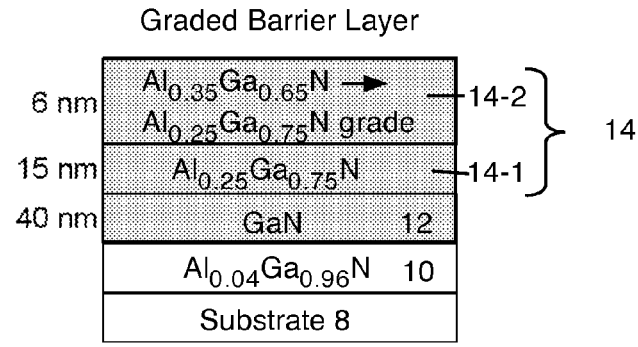
Fig. 1a    Fig. 1b
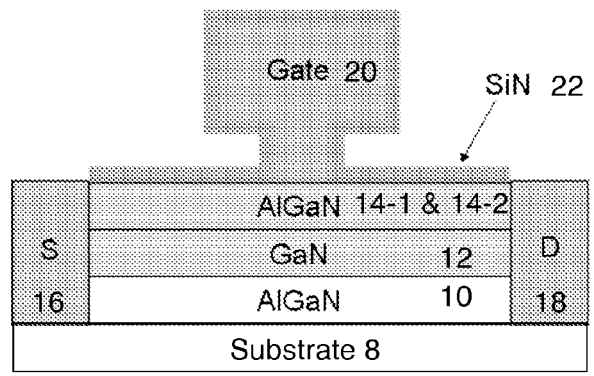
Fig. 2
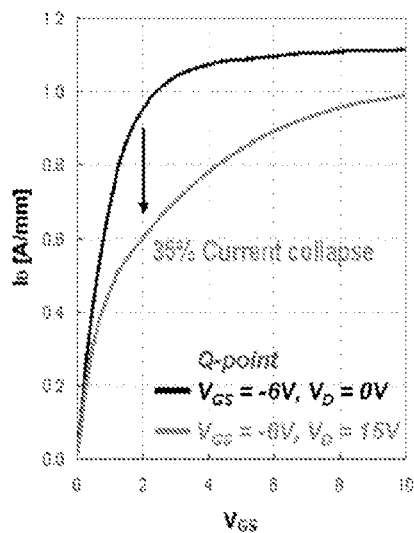 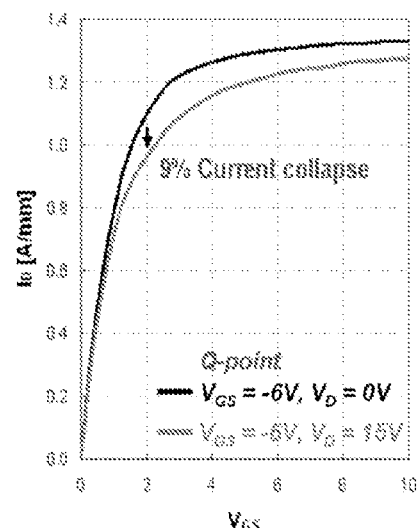
Fig. 3a    Fig. 3b

METHODS RELATING TO A GROUP III HFET WITH A GRADED BARRIER LAYER

CROSS REFERENCE TO RELATED APPLICATIONS

This application is a division of U.S. patent application Ser. No. 13/448,348 filed Apr. 16, 2012 and entitled "GROUP III-N HFET WITH A GRADED BARRIER LAYER", the disclosure of which is hereby incorporated herein by reference.

TECHNICAL FIELD

A group III-N Heterojunction Field Effect Transistor (HFET) with a graded barrier layer which yields improved RF performance for mm-wave devices.

BACKGROUND

A HFET (also known as a High Electron Mobility Transistor (HEMT)) is a field effect transistor incorporating a junction between two materials with different band gaps (i.e., a heterojunction) as the channel instead of a doped region as is generally the case for metal oxide silicon filed effect transistors (MOSFETs).

FIG. 1a depicts a conventional GaN HFET device structure with a buffer 10 of AlGaN disposed on a substrate 8. Buffers 10 of GaN are also known in the prior art. The channel layer 12 is a 40 nm thick layer of GaN and the barrier layer 14 is a 21 nm thick layer of uniform $Al_{0.25}Ga_{0.75}N$. While the layers shown in FIG. 1a are all Un-Intentionally Doped (UID) layers, it is known in the art to add some doping to some of these layers or to layers disposed between these layers. See, for example, Fujiwara "Technique for Development of High Current Density Heterojunction Field Effect Transistors based on (10-10)-Plane GaN By Delta-Doping" US Patent Publication 2011/0057198.

The structure of FIG. 1a is depicted before a gate structure is formed thereon. For higher frequency devices, the gate structure is typically a T-gate.

FIG. 3a depicts pulsed-IV measurements with $V_{gs}=+1V$ and a 200 ns pulse-width of the conventional device of FIG. 1a. The current-collapse taken at $V_{ds}=2V$ is 35% for the conventional device of FIG. 1a.

Current collapse has long been an issue for microwave and millimeter-wave AlGaN/GaN HFETs. Transistors can exhibit a phenomenon known as current collapse, where channel conductance is temporarily reduced after exposure to high voltage. This problem is typically mitigated by using SiN surface passivation. The gate is then fabricated by etching its foot through the SiN and then evaporating and lifting off the gate using a separate lithography step. This prior art process naturally creates a field-plate, and the resulting device is quite useful for frequencies up to the Ka band (26.5-40 GHz).

However, limitations on the gate length and parasitic capacitance introduced by the field plate preclude this process from being used for still higher frequencies. To reduce capacitances while having a short gate length, a "T-gate" structure is typically used. Unfortunately, T-gate devices typically have worse current collapse than field-plated devices because of inherent differences in the passivation process and changes to the E-field profile at the drain-edge of the gate of the device. This remains a major problem for high-frequency group III-nitride devices, particularly for GaN-based devices which can be used at frequencies above the Ka band.

Achieving good power performance at frequencies above the Ka band requires new approaches in the technology. First, T-gates should be used to achieve short gate length with low parasitic capacitance. However, it becomes more difficult to have good passivation of the surface traps with a T-gate process compared with a more conventional field-plated approach. The result is often a very high level of current collapse, which greatly limits output power and efficiency that is achievable in a power amplifier. This is a major limitation which prevents mainstream adoption of GaN HFETs in V-band and W-band applications.

The present invention reduces the level of current collapse compared to the techniques used in the prior art.

BRIEF DESCRIPTION OF THE INVENTION

In one aspect the present invention provides method of making a transistor having a group III-nitride buffer deposited on a substrate; and a group III-nitride heterostructure disposed on a surface of the group III-nitride buffer, wherein the group III-nitride heterostructure has a group III-nitride channel and a group III-nitride barrier layer disposed on a surface of the group III-nitride channel, the group III-nitride barrier layer including Al as one of its constituent group III elements, the Al having a mole fraction which varies at least throughout a portion of said group III-nitride barrier layer.

In another aspect the present invention provides a method of making a transistor, comprising: forming a group III-nitride buffer deposited on a substrate; and forming a group III-nitride heterostructure disposed on a surface of the group III-nitride buffer, wherein the group III-nitride heterostructure has a group III-nitride channel and a group III-nitride barrier layer disposed on a surface of the group III-nitride channel, the group III-nitride barrier layer including Al as one of its constituent group III elements, the Al having a mole fraction which varies at least throughout a portion of said group III-nitride barrier layer.

In yet another aspect the present invention provides a method of reducing current collapse in a HFET device having a channel, a gate and a barrier region between the channel and the gate, the barrier region having aluminum (Al) as one of it constituent elements, the method comprising varying a mole fraction of the aluminum (Al) in said barrier region so that the barrier region has a higher mole fraction of aluminum (Al) closer to said gate than more remote from said gate.

In yet another aspect the present invention provides a method of making a HFET device which has a channel, a gate and a barrier region between the channel and the gate and means for reducing current collapse, wherein where channel conductance is temporarily reduced after exposure to high voltage, the means for reducing current collapse including the element aluminum (Al) in said barrier region wherein the aluminum (Al) in said barrier region has a mole fraction which varies so that the barrier region has a higher mole fraction of aluminum (Al) closer to said gate than more remote from said gate.

BRIEF DESCRIPTION OF THE DRAWINGS

FIG. 1a shows the epitaxial structure of a conventional HFET device while FIG. 1b shows the epitaxial structure of a HFET device having a graded barrier portion in its barrier layer as opposed to a uniform or homogeneous barrier.

FIG. 2 is a cross-sectional view of the final device structure, having a Schottky T-gate and two ohmic contacts. The device is preferably passivated with SiN following gate fabrication.

FIGS. 3a and 3b depicts pulsed-IV measurements with $V_{gs}=+1V$ and a 200 ns pulse-width of both a conventional device (FIG. 3a) and a device with a graded-barrier (FIG. 3b). The current-collapse of each device (taken at $V_{ds}=2V$) is 35% and 9% respectively.

DETAILED DESCRIPTION

FIG. 1a shows the conventional device structure mentioned above. FIG. 1b shows an improved HFET device, having a barrier 14 which includes a graded barrier layer 14-2 as opposed to the uniform barrier 14 of the device of FIG. 1a.

In one embodiment of the graded device, the graded device has a barrier layer 14 comprising two layers 14-1 and 14-2, one of which is preferably uniform and the other of which is preferably graded. Layer 14-1 is preferably a 15 nm thick uniform layer of AlGaN, which is disposed on or above the channel layer 12. The uniform AlGaN layer 14-1 in this embodiment is followed by graded layer 14-2, which is preferably a 6 nm thick layer of AlGaN in which the Al mole fraction is graded from 25% to 35% (with the higher Al mole fraction preferably on the upper surface of buffer 14 adjacent gate 20—see FIG. 2).

Figure 4:
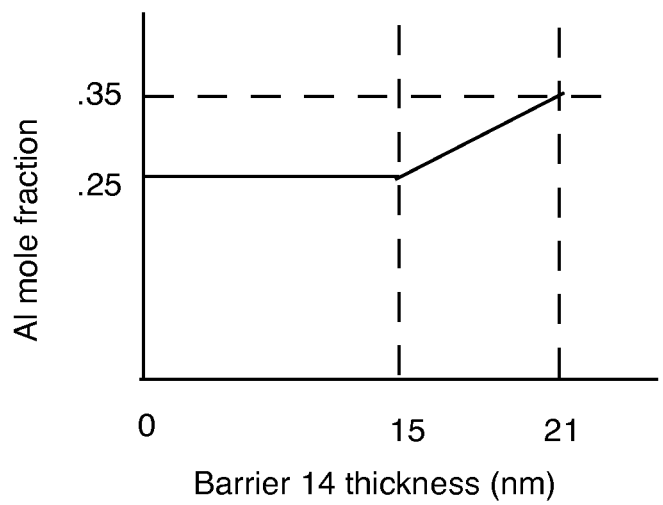
FIG. 4 is a graph of the preferred mole fraction of Al versus barrier thickness.

FIG. 4 is a graph of the preferred mole fraction of Al versus barrier thickness. These thicknesses and mole fractions may be varied as needed to suit the specific application in which a resulting HFET may be utilized. The graph of FIG. 4 shows a linear relationship between the mole fraction of Al and thickness between 15 and 21 nm, but non-linear relationships would also likely prove satisfactory. If InAlN is utilized as barrier 14 then the composition of the graded region 14-2 would preferably begin near $In_{0.17}Al_{0.83}N$ (since that mole fraction results in a lattice which is matched to a GaN channel 12) and increasing Al to $In_xAl_{1-x}N$ in the non-constant portion of a graph of Al mole fraction to barrier thickness, where x<0.17, again with the higher Al mole fraction preferably occurring on surface of buffer 14 adjacent gate 20. The mole fraction of the Al in the InAlN may vary from about $In_{0.17}Al_{0.83}N$ to about $In_{0.01}Al_{0.99}N$ throughout the thickness of layer 14-2, but preferably varies from about $In_{0.17}Al_{0.83}N$ to about $In_{0.07}Al_{0.93}N$ with the thickness of layer 14-2.

Figure 5:
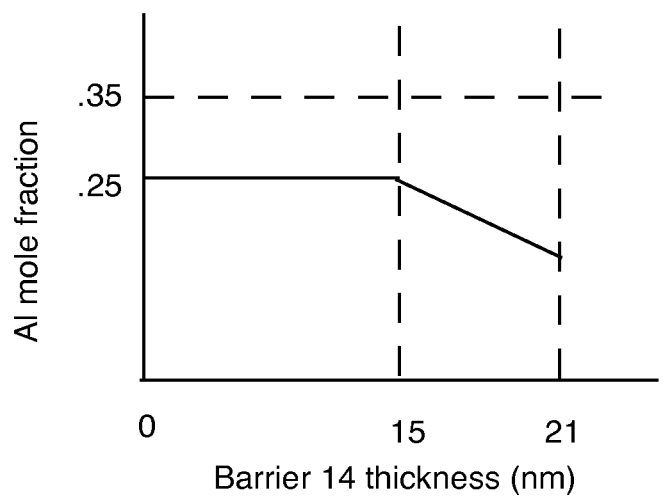
FIG. 5 is a graph of an embodiment where the mole fraction of Al versus barrier thickness also varies with a lower value of the mole fraction of Al occurring next to the gate.

The graph of FIG. 5 shows an alternative embodiment with grading in the opposite direction to that shown in FIG. 4. The HEMT device constructed as shown in FIGS. 1b and 2, but with the grading of FIG. 5 instead of the grading of FIG. 4, possessed no additional improvement to current-collapse, but such a device may have improved reliability.

The channel 12 is preferably a 40 nm thick layer of GaN and the buffer 10 is preferably AlGaN, although some alternative embodiments may utilize GaN instead as layer 10. The buffer 10 is disposed on a substrate 8 which is preferably SiC, but the substrate 8 may be made from other materials such as Si, sapphire, GaN, or other group III-Nitride materials. The thickness of the channel 12 may be varied as needed to suit the specific application that the resulting HFET is to be used in.

FIG. 2 is a cross-sectional view of the final device with a Schottky T-gate 20 and two ohmic contacts 16, 18 which provide the source and drain contracts of the resulting HFET. The resulting HFET device is preferably passivated with SiN following gate fabrication with a thin layer of SiN 22. The final device preferably has a T-gate 20 as depicted by FIG. 2 although a field plated gate structure could be used instead, but it is believed that a field plated gate structure would have degraded high frequency performance compared to the device with a T-gate structure for the reasons previously stated.

Current-collapse is typically characterized with a pulsed-IV measurement. Data for the epitaxial structures of FIGS. 1a and 1b are shown in FIGS. 3a and 3b, respectively. Current-collapse is 35% for the conventional structure of FIG. 1b, but only 9% for the structure of FIG. 1b with a graded barrier 14-2. This is a significant improvement in performance and will significantly improve the performance of Radio Frequency (RF) Monolithic Microwave Integrated Circuits (MMICs) when incorporated therein.

Al, Ga, and In all belong to group III of the periodic table along with other elements. Group III-nitrides include GaN, InAlN, GaAlN, and other group III elements combined with Nitrogen as a nitride for semiconductive purposes. Layers 10, 12, 14-1 and 14-2 are preferably UID layers, but these layers may be doped, and more particularly, have doped regions inside or doped layers between between them for reasons known in the art.

This invention has been described with reference to embodiments of a T-gate HFET. This invention disclosure should also prove useful for field-plated gate HFETs. These are more appropriate for low-frequency RF (<40 GHz) or power-switching applications than T-gate HFETs, but the graded barrier structure may have some advantages to device performance for field-plated gate HFETs as well This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of making a device, comprising:
    forming a III-nitride buffer on a substrate; and
    forming a III-nitride heterostructure disposed on a surface of the III-nitride buffer, wherein the III-nitride heterostructure has
    a III-nitride channel and
    a III-nitride barrier layer disposed on a surface of the III-nitride channel, the barrier layer including Al as one of its constituent elements, the Al having a mole fraction which (i) remains essentially constant throughout a first portion of said group III-nitride barrier layer and (ii) varies at least throughout a second portion of said group III-nitride barrier layer;
    wherein the second portion of the III-nitride barrier layer comprises a AlGaN layer which varies from approximately $Al_{0.25}Ga_{0.75}N$ to approximately $Al_{0.35}Ga_{0.65}N$ with the higher Al mole fraction occurring at said surface of said barrier layer remote from the III-nitride channel.

2. A method of making the device of claim 1 where the device is a HFET and wherein a T-gate structure is formed on the group III-nitride barrier layer.

3. A method of reducing current collapse in a HFET device having a channel, a gate and a barrier region between the channel and the gate, the barrier region having Al as one of its constituent elements, the method comprising varying a mole fraction of the Al in said barrier region so that the barrier region has a higher mole fraction of Al closer to said gate than more remote from said gate.

4. A method of making a HFET device comprising: forming a channel, forming a gate and forming a barrier region between the channel and the gate and providing means for reducing current collapse in said channel, the means for reducing current collapse in said channel comprising aluminum in said barrier region wherein the aluminum in said barrier region has a mole fraction which initially remains constant in a portion of said barrier region next to said channel but which varies in another portion of said barrier region spaced from said channel so that the barrier region has a higher mole fraction of aluminum closer to said gate than more remote from said gate;

wherein the barrier region comprises a AlGaN layer in which the Al mole constant remains essentially constant at approximately $Al_{0.25}Ga_{0.75}N$ for a distance adjacent said channel and thereafter varies during a second distance remote from said channel from approximately $Al_{0.25}Ga_{0.75}N$ adjacent said channel to approximately $Al_{0.25}Ga_{0.65}N$ adjacent said gate.

5. The method of claim 4 wherein the first distance is approximately 15 nm and the second distance is approximately 6 nm.

6. The method of claim 4 wherein the first distance is more than twice the size of the second distance.

7. The method of claim 1 wherein the first portion has a first depth over first the Al mode fraction remains essentially constant and the second portion has a second depth over which the Al mode fraction varies, said first depth being more than twice the size of said second depth.

* * * * *